Figure 1:
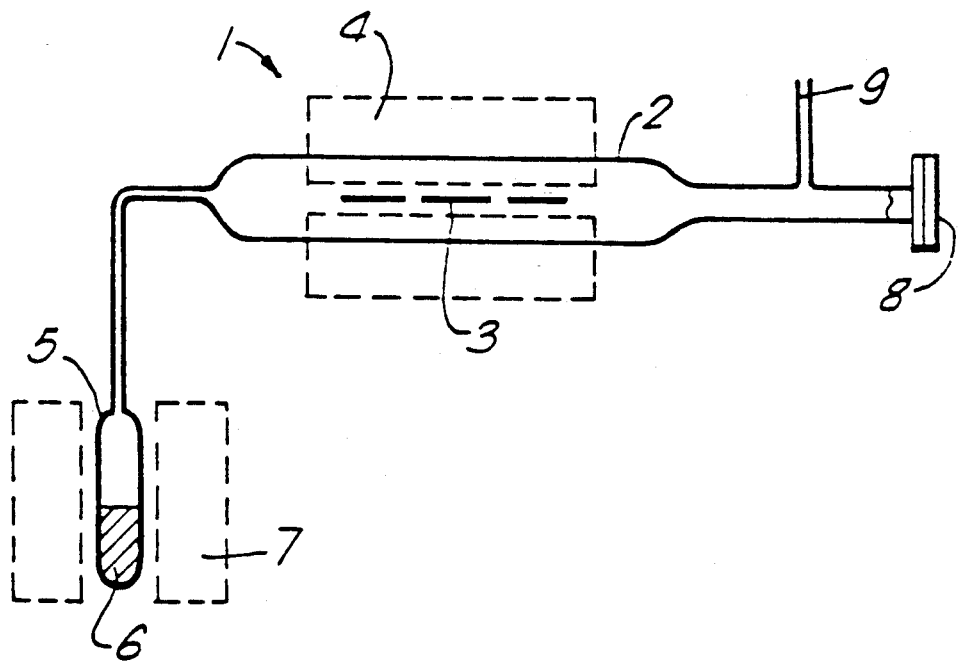

United States Patent [19]

Mackey et al.

[11] Patent Number: 5,116,785
[45] Date of Patent: May 26, 1992

[54] METHOD OF DEPOSITING METAL FLUORIDE

[75] Inventors: Kevin J. Mackey; Anthony W. Vere, both of Worcestershire; Donald C. Bradley, London, all of England; Dario M. Frigo, Utrecht, Netherlands; Marc M. Faktor, deceased, late of london, England, by Jill Faktor, executrix

[73] Assignee: The Secretary of State for Defence in her Britannic Majesty's Government of The United Kingdom of Great Britian and Northern Ireland, London, United Kingdom

[21] Appl. No.: 619,831

[22] Filed: Nov. 30, 1990

[30] Foreign Application Priority Data

Mar. 31, 1988 [GB] United Kingdom ............... 8807793
May 3, 1988 [GB] United Kingdom ............... 8810404

[51] Int. Cl.$^5$ .............................................. C23C 16/22
[52] U.S. Cl. ................................... 437/243; 437/245; 423/490; 423/497; 427/99; 427/227

[58] Field of Search ............... 437/235, 243, 245, 246, 437/250, 165; 423/490, 499; 427/99, 227

[56] References Cited

U.S. PATENT DOCUMENTS 4,718,929 1/1988 Power et al. .................... 423/489

Primary Examiner—Olik Chaudhuri
Assistant Examiner—Andrew Griffis
Attorney, Agent, or Firm—Nixon & Vanderhye

[57] ABSTRACT

A method for forming a layer of a Group II or III fluoride on a semiconductor substrate (e.g. as epitaxial insulating layer) comprising vaporizing a precursor (I), where M is Be, Ca, Sr, Ba or lanthanide, b and d are 0 or 1. A, B, C and D are independently (IIA) or (IIB), X being O, S, NR, PR where R is H, alkyl, perfluoroalkyl; Y is perfluoroalkyl, fluoroalkenyl, fluoroalkylamine or fluoroalkenylamine; Z is H, F, alkyl, perfluoroalkyl or perfluoroalkenyl; and then decomposing the precursor vapor to form M fluoride. A preferred precursor for calcium fluoride is calcium 1,1,1,5,5,5-hexafluor-2,4-pentanedione complex where b and d are 0.

16 Claims, 1 Drawing Sheet

METHOD OF DEPOSITING METAL FLUORIDE

The present invention relates to a method for deposition of metal fluorides onto substrates. In particular the invention relates to a method for deposition of $CaF_2$ as an insulating layer onto a semiconductor substrate.

There is a requirement to produce multi-layer structures of which the simplest example is a sandwich structure containing alternate layers of semiconductor material and insulator on a bulk-grown or epitaxially-grown substrate of the semiconductor material. When forming an insulating or passivating layer it is usual, if epitaxial layers are required, to form the insulating layer upon the substrate which has a lattice structure and spacing the same as or closely equivalent to that of the required epitaxial semiconductor material to be deposited.

It is a consequence of limitations such as this that in selecting insulating materials for epitaxial layer deposition of semiconductor materials $CaF_2$ is used, especially as an insulating layer on bulk-grown or epitaxially deposited silicon or gallium arsenide substrates. However to form an insulating layer of $CaF_2$ or other group II metal fluorides upon a substrate in a form suitable for depositing epitaxial layers of semiconductor material upon it is necessary to transport the $CaF_2$ or other group II metal fluorides or a precursor thereof in a vaporised form to the surface of the substrate.

$CaF_2$ has previously been deposited onto semiconductor substrates from heated Knudsen sources using molecular beam epitaxy but there is a problem in finding a gas phase precursor which is compatible with low temperature vapour phase epitaxy processes such as metallo-organic vapour phase epitaxy. Ideally such precursors should be used at temperatures of less than 400° C.

U.S. Pat. No. 4,718,929 describes a method for deposition of metal halides as transparent glasses by means of vapour phase decomposition of halogenated beta-diketonate complexes of the metal, a preferred type of complex being those formed between 1,1,1,5,5,5-hexafluoro-2,4-pentanedione (also known as hexafluoroacetylacetone):

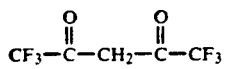

and the metals Li, Na, Be, Mg, Si, Y, Cu, Hf, Ti, Zr, Zn, Pb, Cd, Al, Ga and Ce. The halides are deposited onto glass or optical fibre substrates for the manufacture of optical waveguide preforms.

Various complexes of fluorinated beta-diketonates with Ca are known. For example, J. Chem. Soc. Dalton 6 655-7 (1974) describes complexes of calcium hexafluoroacetylacetonate with additional nitrogen containing ligands. Anal. Chim. Acta 60(1) 109-16 (1972) describes Ca complexes with 1,1,1-trifluoro-5,5-dimethyl-2,4-hexanedione. 6,6,7,7,8,8,8-heptafluoro-1,2-dimethyl-3,5-octanedione and 1,1,1,2,2-pentafluoro-6,6-dimethyl-3,5-heptanedione. The use of these complexes in any sort of $CaF_2$ film deposition is not described, and indeed considering the stability of CaO it would be expected that CaO rather than $CaF_2$ would be formed on thermal decomposition of these complexes.

Anionic complexes of Ca with hexafluoroacetylacetone are also known, e.g. J. Inorg. Chem. 38 41-44 (1976) describes $Na^+$ and $K^+$ salts of the calcium tris-hexafluoroacetylacetonato anion (as well as also describing the hydrated Mg bis-hexafluoroacetylacetonate complex). These anionic complexes would not be expected to be volatile enough for any type of vapour phase deposition methods and in any case could lead to Na or K contamination of a deposited $CaF_2$ film.

The present inventors have unexpectedly discovered that certain fluorinated organometallic compounds may be decomposed in the vapour phase to yield metal fluorides in a form which is particularly suitable for use as an insulating film on semiconductors.

According to this invention a method of forming a layer of a fluoride of a Group II or Group III metal on a semiconductor substrate comprises the steps of:
(1) forming a vapour of one or more fluorinated precursor compounds of formula I:

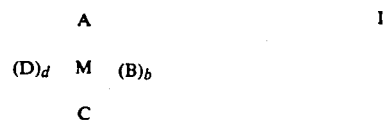

wherein M is an atom or ion of a metal selected from Be, Ca, Sr, Ba or a lanthanide, wherein each of b and d is independently 0 or 1, wherein each of A, B, C and D is independently selected from bidentate ligands of formula IIA or IIB:

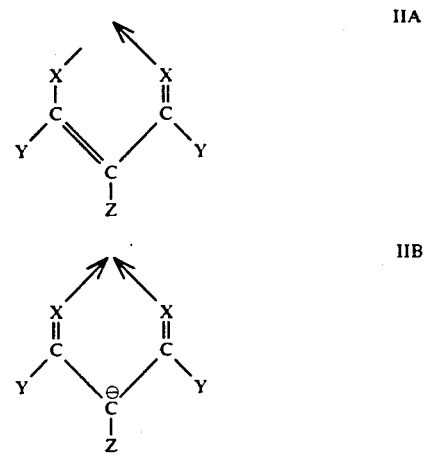

wherein X is independently selected from O, S, NR or PR, R being H, $C_{1-10}$ alkyl or $C_{1-10}$ perfluoroalkyl; each Y being independently selected from $C_{1-10}$ alkyl, $C_{1-10}$ perfluoroalkyl, $C_{1-10}$ fluoroalkenyl, $C_{1-10}$ fluoroalkylamine and $C_{1-10}$ fluoroalkenylamine; Z being selected from H, F, $C_{1-10}$ alkyl, $C_{1-10}$ perfluoroalkyl and $C_{1-10}$ fluoroalkenyl provided at least one of Y or Z is or contains fluorine: and:
(2) causing the vapour of the said precursor compound to decompose in the vicinity of the substrate surface to form a layer of a fluoride of the metal M.

It will be understood by those skilled in the art that due to resonance delocalisation of the electrons in the compound of formula I the compound and ligands may exist as a resonance hybrid of a number of canonical extremes and formula I is intended to include all of these.

Preferably the metal M is Ca or La. Typically the number of groups of formula IIA or IIB coordinating to the metal M will depend upon the selection of M and the steric bulk of the ligands. When M is Ca, b and d are preferably both 0, with each group A and C coordinating through each atom X to M giving a four coordinate structure as shown in formula III below:

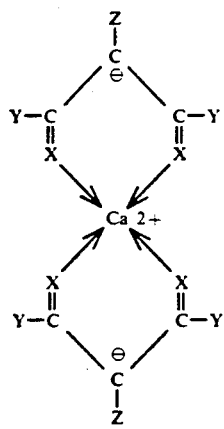

III

Preferred compounds of formula I and III are those in which all of the ligands A, C and B and D if present are the same. The coordination sphere may be expanded in such compounds by bridging between the metal centres.

Preferred compounds of formula I and III are those where X is NR or especially O, Y is $C_{1-10}$ alkyl or $C_{1-10}$ perfluoroalkyl; Z is H, F or a $C_{1-10}$ perfluoroalkyl. Most preferably if perfluoroalkyl groups are present they are perfluortertiarybutyl ($—C(CF_3)_3$) or perfluoromethyl ($—CF_3$). It is particularly preferred that ligands A and C, and B and D when present are anions of fluorinated betadiketonates, e.g. of 1,1,1,5,5,5-hexafluoro-2,4-pentanedione; 6,6,7,7,8,8,8-heptafluoro-2,2-dimethyl-3,5-octanedione: 1,1,1-trifluoro-2,4-pentanedione and 1,1,1,5,5,6,6,7,7-decafluoro-2,4-heptanedione. A preferred precursor for deposition of $CaF_2$ is the calcium 1,1,1,5,5,5-hexafluoro-2,4-pentanedione complex IV:

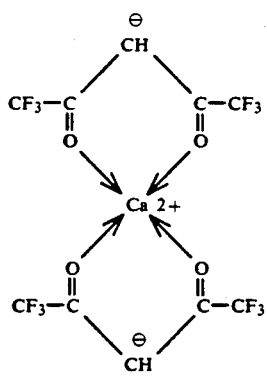

IV which is believed to be a novel compound. Known Ca complexes as described in the prior art referred to above may also be suitable for use in the method of this invention, i.e. V, VI and VII:

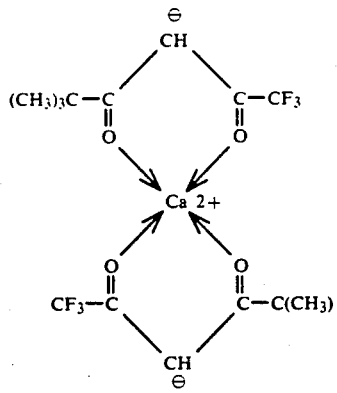

V

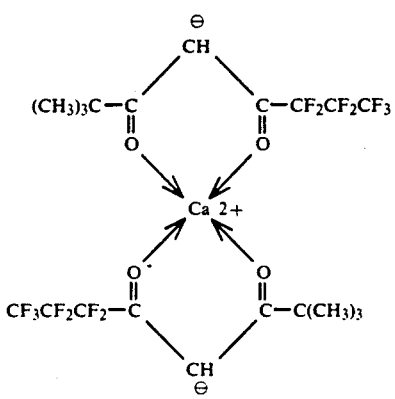

VI

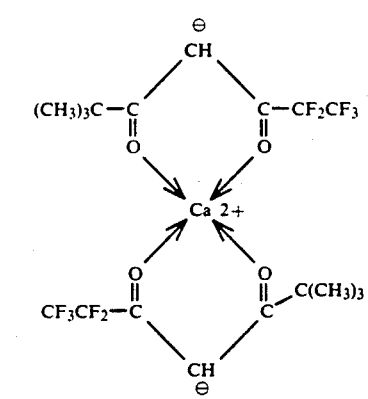

VII

This invention also provides a method for preparing compounds of formula I, III or IV, which comprises reacting the metal M with a fluorinated organic compound of formula VIII:

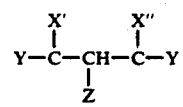

VIII wherein each X' and X" is independently selected from OH, $NH_2$, O, S, NH, PH, NR or PR, each Y is independently selected from $C_{1-10}$ alkyl, perfluoroalkyl or perfluoroalkylamine, wherein Z is selected from F, H, $C_{1-10}$ perfluoroalkyl and $C_{1-10}$ alkyl, and depending upon the nature of groups X' and X" the C—X' and C—X" bonds may be single or double, provided that at least one of Y and Z is or contains F.

When preparing compounds of formula I to IV it is preferable to keep the reactants as dry as possible to ensure that reasonable yields of product are obtained. Well known methods of drying can be used provided they do not interfere with the reactants or product, a suitable method of drying the organic reagent would be drying over anhydrous sodium sulphate. It is also prefereable to distil the organic compound in vacuo. Preferably no solvents are used in the method and the organic reactant is distilled in vacuo onto the metal.

For the preparation of the preferred compounds of formula III e.g. of formula IV calcium metal is reacted in the absence of solvents with 1,1,1,5,5,5hexafluoropentan-2,4-dione VIIIA:

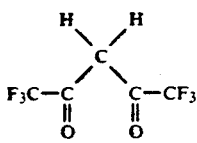

Formula VIIIA

The molar ratio of organic reactant to metal chosen will depend upon the number of ligands coordinating to the metal in the product.

The reaction preferably take place at a temperature between 0° and 100° C. and is conveniently conducted at room temperature preferably with stirring of the reaction mixture. It is also preferable to conduct the reaction under a stream of dry inert gas such as nitrogen to allow escape of hydrogen. The reaction can be allowed to proceed for any length of time but to achieve a reasonable yield of product the preferred duration is about 2 days.

When the reaction is complete any excess organic reactant can be removed by heating under reduced pressure or any other suitable method. Additional purification can be achieved by sublimation of the product where this is feasible. The precursor product should be stored in the absence of air, e.g. under dry nitrogen or in vacuo.

Suitable and preferred conditions for carrying out the method of the invention will now be described. The deposition method of the invention may conveniently be performed in an essentially conventional vapour phase deposition apparatus, i.e. having an area in which the precursor may be vapourised at a suitable temperature and pressure, a gas transfer manifold system to enable the precursor vapour to be transported to the vivinity of the substrate, and appropriate decomposition means such as a substrate heater and/or a means for directing radiation of a suitable wavelength onto the substrate surface or at least over areas where deposition is required.

It is preferred to clean the substrate surface prior to deposition of the metal fluoride layer, and this may conveniently be done by known cleaning methods (e.g. solvents etc.) followed by evacuation and esposure of the surface to ultraviolet radiation.

Typically the vapour of the precursor of formula I, III or IV is formed by heating the precursor compound or a compound such as an adduct of the precursor compound which forms the vapour of the precursor on heating. The compounds of formula I, III or IV typically vapourise at about 100° C. or less. A suitable pressure for the deposition is around $5 \times 10^{-4}$ torr, but pressure does not appear to be crucial. Thermal decomposition of the precursor occurs at about 250° C. at this pressure. In a typical deposition method of this invention to deposit an epitaxial insulating layer of $CaF_2$ onto a substrate such as epitaxial gallium arsenide, the precursor of formula IV is heated to 100° C. under a pressure of ca $10^{-3}$ torr, passed at this pressure into the vicinity of the substrate heated to ca 300° C. when decomposition occurs to deposit an epitaxial $CaF_2$ layer.

The high substrate temperatures involved when thermal decomposition of the precursor is employed can in some instances lead to interdiffusion and/or cracking of the deposited layer or its separation from the substrate surface. Accordingly it is preferred to decompose the vapourised precursor either solely with radiation, especially ultraviolet, or with a combination of heat and radiation (i.e. photoassisted decomposition) so as to involve a lower substrate temperature, e.g. a temperature just sufficient to prevent condensation of the precursor on the substrate, e.g. about 100° C. A pressure of around $10^{-3}$ torr is again suitable but pressure does not appear to be crucial. A convenient source of ultraviolet radiation is a high pressure mercury lamp, and wavelengths of less than about 254 nm appear to be necessary to effect decomposition.

The precursors of formula I, III and IV may conveniently deposit epitaxial insulating layers on substrates of bulk-grown or epitaxial semiconductor materials. Typically the choice of precursor will depend on matching as closely as possible the epitaxial lattice parameters of the semiconductor material being deposited with those for the appropriate metal fluoride, for example calcium fluoride is a close match in lattice parameter to that for gallium arsenide.

The use of precursors of two or more Group II metals, both of formula I together in the method of the present invention gives a means for "tuning" the lattice parameters of the insulating layer to match more exactly those of the semiconductor material. For example the deposition of a mixture of approximately 50 mole percent calcium fluoride 50 mole percent strontium fluoride, can result in a deposited layer which has a lattice parameter identical to that of gallium arsenide. Precursors of the present invention are also useful for group II metal fluoride deposition as they decompose at relatively low temperatures but are volatile enough to be vapourised and transported to a substrate material and then decomposed there to provide an insulating layer which is of high purity as the by-products are volatile and can be removed.

The invention will now be described by way of nonlimiting example with reference to FIG. 1 which shows a thermal decomposition apparatus, and FIG. 2 which shows a modification of the apparatus of FIG. 1 to enable photolytic decomposition.

EXAMPLE 1

Preparation of Bis (1,1,1,5,5,5-hexafluoropentan-2,4-dionato) Calcium (11) (fluorinated calcium acetyl acetonate) Formula IV A sample of 1,1,1,5,5,5-hexafluoropentan-2,4-dione (hfac) (21,1 g. 101 mmol) was dried over anhydrous $Na_2SO_4$ and distilled in vacuo onto calcium metal (3.0 g, 75 mmol). The contents were stirred at room temperature for 48 hours under a stream of dry nitrogen to allow escape of hydrogen. The unreacted hfac was removed by heating to 60°–70° C./$10^{-2}$ mm Hg to leave an off-white residue and the compound $Ca(hfac)_2$ was sublimed at 130° C./$10^{-2}$ mmHg (5.4 g, 25% yield).

This compound begins to vapourise at the relatively low temperature of 47° C. and shows no decomposition at 100° C.

EXAMPLE 2

Identifying Thermal Decomposition Products by Mass Spectroscopy

A sample of bis (1,1,1,5,5,5-hexafluoropentan-2, 4-dionato) Calcium (11) from example 1 was heated in vacuo ($5 \times 10^{-4}$ Torr) at temperatures upto 300° C. and the reaction products examined by mass pectroscopy. In addition to the normal peaks associated with C, $O_2$ and water vapour, the mass spectrograph showed peaks at masses 40, 69 and 138 suggesting the presence of ions due to $Ca^+$, $CF_3^+$ and $(CF_3COCHCO)^+$ respectively.

EXAMPLE 3

Deposition of Calcium Fluoride using Thermal Decomposition

A deposition apparatus (1) shown schematically consists of a deposition cell (2) containing substrates (3) of single crystal gallium arsenide, and which is surrounded by a heating furnace (4) The deposition area (2) is connected to a source container (5) containing a small quantity (ca 1 gm) of a source calcium bis—(1,1,1,5,5,5-hexafluoropentan-2, 4-dionate) (6), and also surrounded by a heating furnace (7).

The substrates (3) and source (6) were loaded via loading port (8), whence substrates (3) could be removed after the deposition method was complete. The apparatus (1) is connected via outlet (9) to a sorption pump, ion pump and mass spectrometer (not shown). Other valves, control apparatus etc conventional to the art is also not shown.

In use, the apparatus is evacuated to $5 \times 10^{-4}$ torr and the substrates (3) heated to 300° C., using furnace (4). The source (6) was then heated to 100° C. for a period of 2 hours, after which the source (6) and subsequently the substrates (3) were cooled to room temperature.

On removal via port (8) the substrates were found to be covered with a layer of material approximately 4000 Å thick.

Auger analysis of the layer confirmed the presence of calcium and fluorine, although the exact ratio was not determined owing to problems with surface charge, possible electron beam desorption of fluorine, and the lack of an adequate $CaF_2$ standard. Oxygen contamination of the film was found to be low ($<3\%$) and carbon was below the detection limit, X-ray analysis confirmed that the layer material was polycrystalline and showed a lattice spacing corresponding to calcium fluoride.

EXAMPLE 4

Deposition of Calcium Fluoride using Photolytic Decomposition

Figure 2:
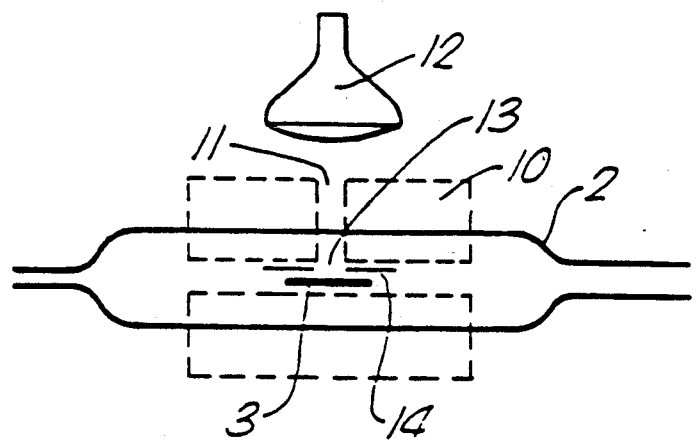

A modified form of the apparatus of FIG. 1 was used in which furnace (4) was replaced by a furnace (10) having an aperture (11) through which ultraviolet radiation from a high pressure mercury lamp (12) could be shone onto the substrate (3) through an aperture (13) in a mask (14). The lamp (12) was capable of emitting two principal wavelengths, 185 and 254 nm.

In use the cell (2) and source (5) were evacuated as in example 1, then UV light from the lamp (12) was shone onto the substrate (3) to cause desorption of impurities on the surface. After a period of such cleaning, the furnaces (4) and (10) were heated tl 100° C. so that vapour of the source (6) passed over the substrate (3). A quartz filter (not shown) was placed between the lamp (12) and the aperture (11) so as to allow only UV light of 254 nm wavelength to pass through. After an appropriate time the substrate (3) was removed and examined as in example 1 and no deposition was observed.

The experiment was repeated without the quartz filter so that UV light of both 185 and 254 nm passed. After about 2 hours the substrate was removed and examined and a deposited film about 2-3000 Å was observed over the region of the substrate (3) surface beneath the aperture (13). ESCA and XPS analysis of this deposit showed that it was virtually pure $CaF_2$, with less than 3% oxygen and with carbon at the limit of detection, only four elements (Ca, F, O, C) being detected.

We claim:

1. A method of forming a layer of a fluoride of a Group II or Group III metal on a semiconductor substrate, characterised by steps (1) and (2):

(1) forming a vapour of one or more fluorinated precursor compounds of formula I:

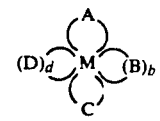

I wherein M is an atom or an ion of a metal selected from Be, Ca, Sr Ba or a lanthanide, wherein each of b and d is independently 0 or 1, wherein each of A, B, C and D is independently selected from bidentate ligands of formula IIA or IIB:

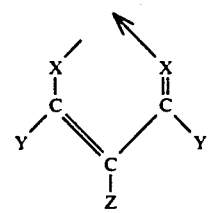

IIA

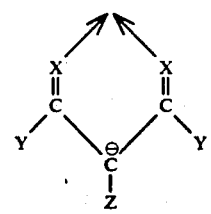

IIB wherein X is independently selected from O, S, NR or PR, R being H, $C_{1-10}$ alkyl or $C_{1-10}$ perfluoroalkyl; each Y being independently selected from $C_{1-10}$ alkyl, $C_{1-10}$ perfluoroalkyl, $C_{1-10}$ fluoroalkenyl, $C_{1-10}$ fluoroalkylamine and $C_{1-10}$ fluoroalkenylamine; Z being selected from H, F, $C_{1-10}$ alkyl. $C_{1-10}$ perfluoroalkyl and $C_{1-10}$ fluoroalkenyl provided at least one of Y or Z is or contains fluorine: and:

(2) causing the vapour of the said precursor compound to decompose in the vicinity of the substrate surface to form a layer of a fluoride of the metal M.

2. A method according to claim 1 characterised in that the metal M is selected from calcium or lanthanum.

3. A method according to claim 2 characterised in that M is calcium and the compound of formula I has a formula III:

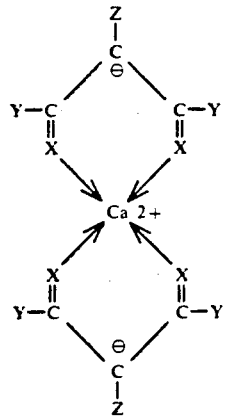

X, Y and Z being as defined in claim 1.

4. A method according to claim 1 characterised in that X is oxygen, Y is $C_{1-10}$ alkyl or $C_{1-10}$ perfluoroalkyl and Z is H, F, or a $C_{1-10}$ perfluoroalkyl group.

5. A method according to claim 3 characterised in that X is oxygen Y is $C_{1-10}$ alkyl or $C_{1-10}$ perfluoroalkyl and Z is H, F or a $C_{1-10}$ perfluoroalkyl group.

6. A method according to claim 1 characterised in that all of the ligands coordinating M are the same.

7. A method according to claim 3 characterised in that the compound of formula III is the complex of calcium with 1,1,1,5,5,5-hexafluoro-2,4-pentane dione of formula IV:

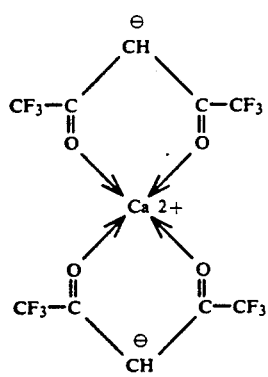

8. A method according to claim 3 characterised in that the compound of formula III has a formula selected from V, VI and VII:

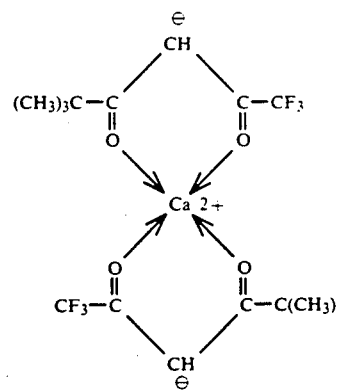

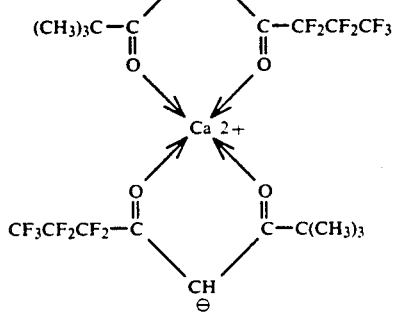

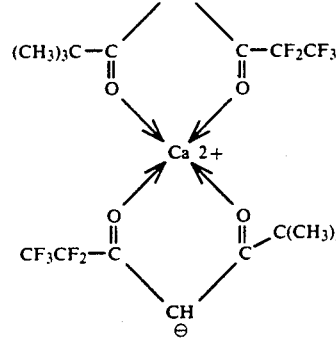

9. A method according to claim 1 characterised in that the compound of formula I is decomposed by heat or a combination of heat and radiation.

10. A method according to claim 6 characterised in that the compound of formula 1 is decomposed by heat or a combination of heat and radiation.

11. A method according to any one of claims 1 to 5 or 7 or 8 characterised in that the compound of formula I is decomposed by ultraviolet light.

12. A method according to claim 6 characterised in that the compound of formula I is decomposed by ultraviolet light.

13. A method according to claim 1 characterised in that the semiconductor is gallium arsenide.

14. A method according to claim 1 characterised in that the layer of fluoride of the metal M is formed as an epitaxial layer.

15. A method according to claim 1 characterised in that two or more compounds of formula I are used, having different metals M.

16. A method according to claim 15 characterised in that a compound of formula I in which M is calcium and a compound of formula I in which M is strontium is used.

* * * * *

UNITED STATES PATENT AND TRADEMARK OFFICE
CERTIFICATE OF CORRECTION

| | | |
|---|---|---|
| PATENT NO. | : 5,116,785 | Page 1 of 1 |
| APPLICATION NO. | : 08/619831 | |
| DATED | : May 26, 1992 | |
| INVENTOR(S) | : Mackey et al. | |

It is certified that error appears in the above-identified patent and that said Letters Patent is hereby corrected as shown below:

On the Title Page insert the following:
[62] Continuation of PCT/GB89/00338 filed March 31, 1989.

Signed and Sealed this

Eighth Day of August, 2006

JON W. DUDAS
*Director of the United States Patent and Trademark Office*